US007509858B2

United States Patent
Ikegami

(10) Patent No.: US 7,509,858 B2
(45) Date of Patent: Mar. 31, 2009

(54) ACCELERATION SENSOR MANUFACTURABLE BY SIMPLIFIED METHOD

(75) Inventor: Naokatsu Ikegami, Saitama (JP)

(73) Assignee: OKI Semiconductor Co., Ltd., Tokyo (JP)

( * ) Notice: Subject to any disclaimer, the term of this patent is extended or adjusted under 35 U.S.C. 154(b) by 389 days.

(21) Appl. No.: 11/291,849

(22) Filed: Dec. 2, 2005

(65) Prior Publication Data

US 2006/0130580 A1   Jun. 22, 2006

(30) Foreign Application Priority Data

Dec. 22, 2004   (JP)   ............... 2004-371103

(51) Int. Cl.
 *G01P 15/12*   (2006.01)
(52) U.S. Cl. ................. 73/514.33; 73/514.38
(58) Field of Classification Search ............. 73/514.01, 73/514.33, 514.36, 514.38
See application file for complete search history.

(56) References Cited

U.S. PATENT DOCUMENTS 5,313,836 A * 5/1994 Fujii et al. ............... 73/514.16
5,656,846 A * 8/1997 Yamada ..................... 257/420

FOREIGN PATENT DOCUMENTS

JP   2004-198243   7/2004

* cited by examiner

*Primary Examiner*—John E Chapman
(74) *Attorney, Agent, or Firm*—Rabin & Berdo, P.C.

(57) ABSTRACT

An acceleration sensor has a mass movably linked to a peripheral attachment section to which at least one stopper is attached to stop the motion of the mass in a certain direction. In the absence of acceleration, the mass rests at a distance from a first surface of the stopper. A quantity of a curable elastic adhesive on a second surface of the stopper absorbs impact of the mass on the first surface, enabling the acceleration sensor to survive mechanical shock. The curable elastic adhesive may adhere to the cover of a package in which the acceleration sensor is enclosed. The curable elastic adhesive may be applied as a drop or swath from a dispenser, which simplifies the manufacturing process and reduces the manufacturing cost.

29 Claims, 6 Drawing Sheets

ACCELERATION SENSOR MANUFACTURABLE BY SIMPLIFIED METHOD

BACKGROUND OF THE INVENTION

1. Field of the Invention

The present invention relates to a three-axis (XYZ) acceleration sensor and its method of manufacture, more particularly to a simplified method of providing improved impact resistance.

2. Description of the Related Art

Technology for making an acceleration sensor resistant to destruction by impact is described in, for example, Japanese Patent Application Publication No. 2004-198243. The acceleration sensor described therein has a mass attachment section, a peripheral attachment section surrounding the mass attachment section, beams flexibly linking the mass attachment section to the peripheral attachment section, resistive elements disposed on the surfaces of the beams and producing piezoresistive effects, a mass secured to the mass attachment section, a frame securing the peripheral attachment section to its package so that the rest position of the mass is a prescribed distance above the floor of the package, stoppers attached to the peripheral attachment section to restrict the motion of the mass, which is disposed between the stoppers and the floor of the package, and aluminum reinforcements on the stoppers. Under acceleration in a given direction the mass is displaced in the opposite direction, the beams bend, and the electrical resistance of the resistive elements disposed on the surfaces of the beams changes. The magnitude and direction of the acceleration are calculated from these resistance changes.

If the acceleration is directed upward from the floor of the package, the beams sag and the mass moves downward, stopping when it strikes the package floor. If the acceleration is directed downward toward the package floor, the mass moves away from the package floor, stopping when the outer corners of the mass strike the stoppers. The aluminum reinforcements on the stoppers enable the stoppers to withstand the impact of the mass caused by sudden acceleration in the downward direction. A typical requirement is for the acceleration sensor to be able to survive a fall from a height of one and a half meters (1.5 m), which generates an impact force or acceleration equivalent to about six thousand times the acceleration caused by gravity (6000 G).

A problem with this acceleration sensor is that in order to obtain an impact resistance rating of at least 6000 G, the conventional stopper structure requires the deposition of an aluminum reinforcing film at least several tens of micrometers thick. If this film is deposited by one of the processes commonly used in semiconductor fabrication, e.g., a sputtering process, deposition takes much time and the acceleration sensor cannot be manufactured efficiently. Additional mask deposition and patterning steps are also required, making the manufacturing process still more time-consuming, complex, and expensive. A simpler way to reinforce the stoppers is needed.

SUMMARY OF THE INVENTION

An object of the present invention is to simplify the manufacture of an acceleration sensor.

Another object is to reduce the manufacturing cost of an acceleration sensor.

The invention provides an acceleration sensor having a mass movably linked to a peripheral attachment section so that, in response to acceleration, the mass can move in at least one direction relative to the peripheral attachment section. At least one stopper is fixedly attached to the peripheral attachment section to stop the motion of the mass in this one direction. The stopper has a first major surface and a second major surface. The first major surface is disposed between the second major surface and the mass and, absent acceleration, is spaced from the mass in the above direction. A quantity of a curable elastic adhesive is disposed on the second major surface of the stopper to absorb impact of the mass on the first major surface of the stopper. The curable elastic adhesive may adhere to the cover of a package in which the acceleration sensor is enclosed.

The curable elastic adhesive can be applied as a drop or swath from a dispenser. This process is considerably simpler and less expensive than the conventional process of depositing an aluminum film to reinforce the stopper.

The invention also provides a method of manufacturing the above acceleration sensor. The method starts from a semiconductor wafer having a first semiconductor layer, a second semiconductor layer, and a bonding layer joining the first semiconductor layer to the second semiconductor layer.

The manufacturing steps include:

forming a strain sensing device for converting mechanical strain in the first semiconductor layer to electrical output;

forming a plurality of openings in the first semiconductor layer to define a peripheral attachment section, a mass attachment section, at least one beam flexibly linking the mass attachment section to the peripheral attachment section, and at least one stopper disposed on an inner side of the peripheral attachment section;

removing part of the second semiconductor layer, leaving a mass and a frame surrounding the mass, the frame including a peripheral part of the second semiconductor layer;

removing the bonding layer between the stopper and the mass, leaving a part of the bonding layer joining the mass attachment section to the mass and a part joining the peripheral attachment section to the frame; and applying silicone rubber from a dispenser to the stopper. The silicone rubber is applied in a liquid state and cures to an elastic solid state.

The silicone rubber may also be applied to an adjacent surface of the peripheral attachment section.

The silicone rubber may be applied as, for example, one drop per stopper; a plurality of drops per stopper; or a single swath covering at least part of all of the stoppers and part of the adjacent surface of the peripheral attachment section.

Applying one drop per stopper maximizes the simplicity and minimizes the cost of the silicone rubber application step.

Applying a plurality of drops of silicone rubber per stopper improves the impact resistance of the acceleration sensor and enables the impact sensor to be enclosed in a thinner package, since the individual drops can be lower in height than a single drop.

Applying the silicone rubber as a single swath also enables the impact sensor to be enclosed in a thinner package. A uniformly thin swath of silicone rubber can be applied by having the dispenser retrace the final part of the swath, moving backward from the final application point, and lifting the dispenser away from the swath as the dispenser moves over the adjacent surface of the peripheral attachment section.

DETAILED DESCRIPTION OF THE INVENTION

Figure 1:
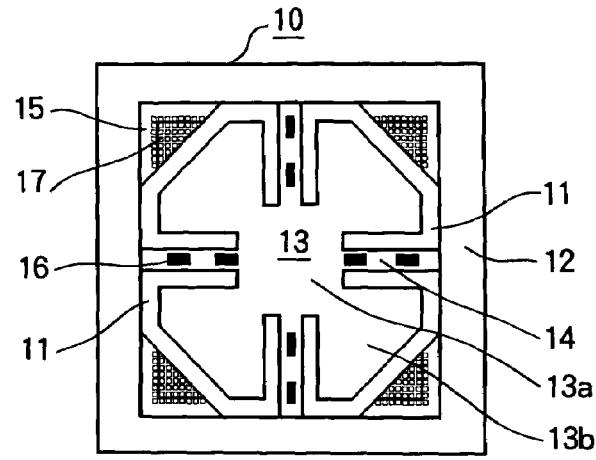
FIG. 1 and FIG. 2 are simplified plan views of an acceleration sensor in a first embodiment of the invention.

Embodiments of the invention will now be described with reference to the attached drawings, in which like elements are indicated by like reference characters.

First Embodiment

Figure 4:
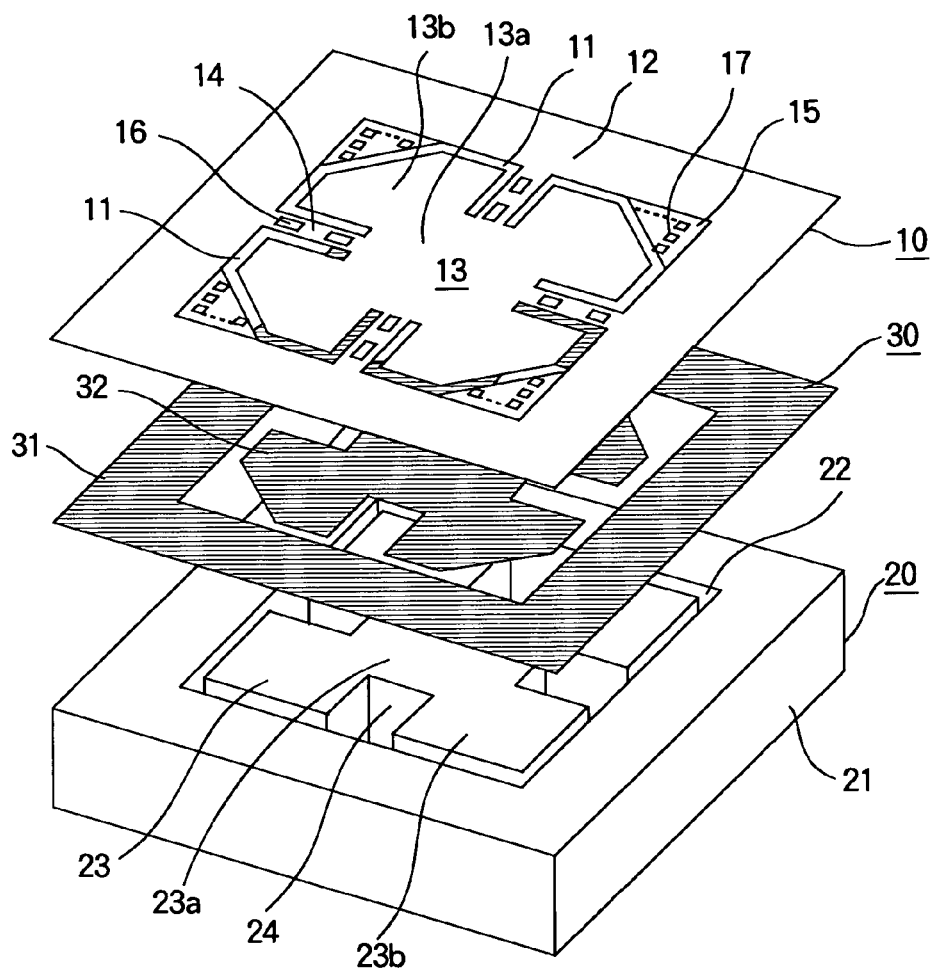
FIG. 4 is a simplified perspective view of the acceleration sensor in the first embodiment.
Figure 5:
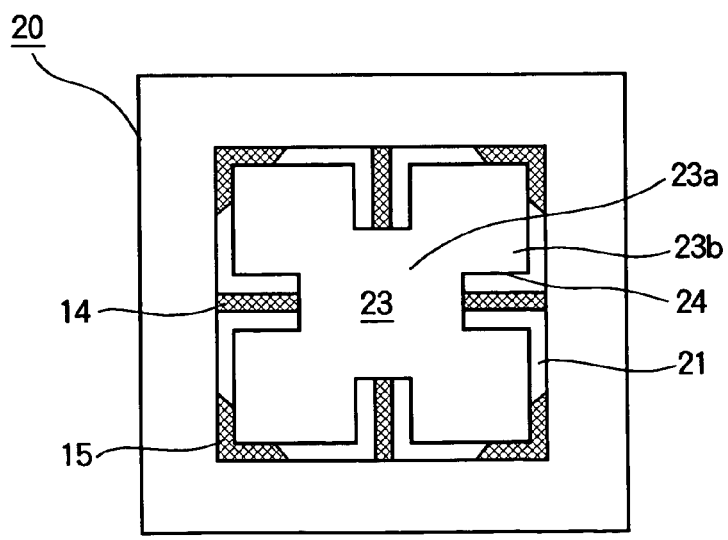
FIG. 5 is a bottom plan view of the acceleration sensor in the first embodiment.

A first embodiment will be described with reference to the top plan views in FIGS. 1 and 2, the sectional view in FIG. 3, the perspective view in FIG. 4, and the bottom plan view in FIG. 5.

The first embodiment is an acceleration sensor formed in a silicon-on-insulator (SOI) wafer by etching and other processes. The SOI wafer includes a first silicon substrate 10 approximately ten micrometers (10 μm) thick, a second silicon substrate 20 approximately 525 μm thick, and an insulating bonding layer 30 by which the first silicon substrate 10 and second silicon substrate 20 are joined.

The first silicon substrate 10 of a single acceleration sensor has a substantially square shape measuring about two and a half millimeters (2.5 mm) on a side, in which four openings or trenches 11 are provided to define a peripheral attachment section 12, a mass attachment section 13, beams 14, and stoppers 15. The peripheral attachment section 12 is an area approximately 500 μm wide, disposed at the periphery of the first silicon substrate 10. The mass attachment section 13 comprises a central mass attachment section 13a and four outer mass attachment sections 13b. The central mass attachment section 13a has a substantially square shape measuring about 700 μm on a side and occupies the center of the first silicon substrate 10; the outer mass attachment sections 13b have substantially inverted triangular shapes and are attached to the four corners of the central mass attachment section 13a. The trenches 11 are shaped so that they partially surround each outer mass attachment section 13b. The peripheral attachment section 12 and central mass attachment section 13a are mutually linked by the four beams 14, which are about 400 μm wide and extend orthogonally from the sides of the peripheral attachment section 12 and central mass attachment section 13a. On the surfaces of the beams 14, resistive elements 16 are formed that produce piezoresistive effects by which mechanical strain is converted to a variation in electrical resistance.

Stoppers 15 with a substantially right triangular shape are disposed at the inside corners of the peripheral attachment section 12 so as to face respective outer mass attachment sections 13b across the trenches 11. A plurality of small openings 17 are formed in each of the stoppers 15.

The second silicon substrate 20 includes a frame 21 approximately 500 μm wide, formed at the periphery below the peripheral attachment section 12, and a mass 23 surrounded by the frame 21 and separated therefrom by a space 22. The mass 23 has a shape corresponding generally to the combined shape of the mass attachment section 13 and stoppers 15 in the first silicon substrate 10, comprising a prismatic central mass 23a corresponding to the central mass attachment section 13a, and four prismatic outer masses 23b corresponding to the outer mass attachment sections 13b and stoppers 15, attached to the four corners of the central mass 23a. The silicon between each adjacent pair of outer masses 23b is removed to form four trenches 24, disposed generally below the beams 14 in the first silicon substrate 10. As can be seen in FIG. 3, the mass 23 is thinner than the frame 21 by an amount equal to the maximum allowable displacement (for example, 5 μm).

The first silicon substrate 10 and second silicon substrate 20 are mutually joined through the oxide films 31 and 32 constituting the parts of the bonding layer 30 left below the peripheral attachment section 12 and mass attachment section 13, respectively. As shown in FIG. 3, the surface of the first silicon substrate 10 is covered with an insulating protective film 40. Interconnection pads 41 comprising, for example, an aluminum film are formed on the protective film 40 in the peripheral attachment section 12 and connected to the resistive elements 16.

Figure 2:
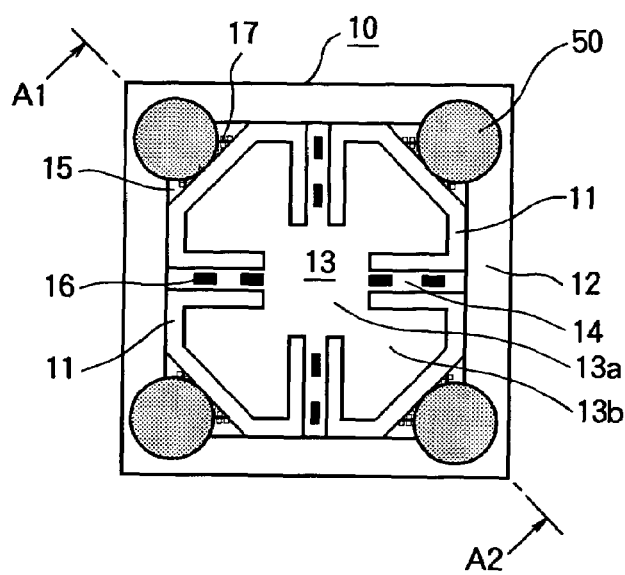
Figure 3:
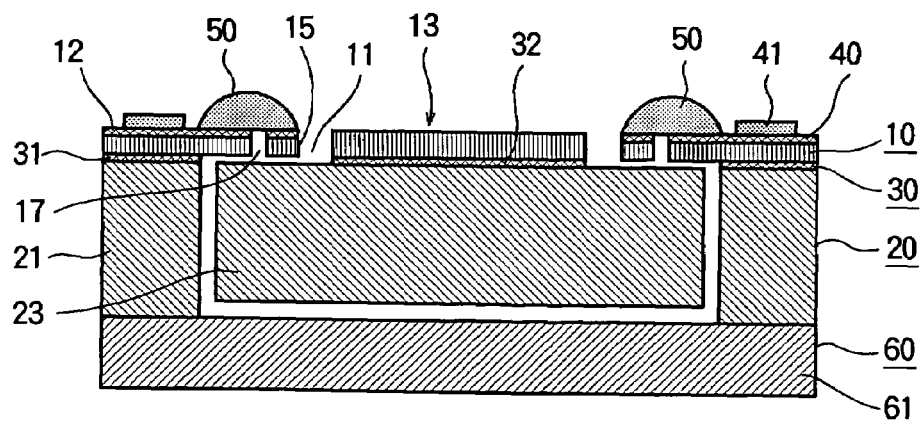
FIG. 3 is a sectional view through line A1-A2 in f2b of the acceleration sensor in the first embodiment.

Referring to FIGS. 2 and 3, to reinforce the stoppers 15, a curable elastic adhesive 50 is applied to the protective film 40 on each stopper 15 as a drop from a dispenser. The drop includes a prescribed quantity of adhesive, sufficient to make the drop at least 250 μm thick. The adhesive 50 should have good mechanical and chemical properties. To facilitate application of the desired quantity, the adhesive preferably takes the form of a highly viscous liquid paste and cures to an elastic solid state after application. In the following description, the curable elastic adhesive will be assumed to be silicone rubber.

The acceleration sensor having the structure described above is mounted on a sensor mounting area (for example, the floor 61 of a package 60 as shown in FIG. 3) and secured with an adhesive or the like.

Next, fourteen steps in a method of manufacturing the acceleration sensor in FIG. 1 will be described with reference to FIGS. 6 to 19.

Figure 6:
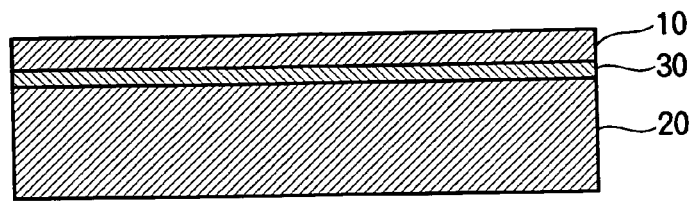
FIGS. 6, 7, 8, 9, 10, 11, 12, 13, 14, 15, 16, 17, 18, and 19 are sectional views illustrating a manufacturing process for the acceleration sensor in the first embodiment.

Referring to FIG. 6, in the first step, an SOI wafer is obtained. The wafer includes, for example, an n-type first silicon substrate 10 with a thickness of 10 μm and a volume resistivity of about six to eight ohms per centimeter (6-8 Ω/cm), a second silicon substrate 20 with a thickness of 525 μm and a volume resistivity of about 16 Ω/cm, and a silicon oxide bonding layer 30 with a thickness of about 4 μm, by which the first silicon substrate 10 and second silicon substrate 20 are joined.

Figure 7:
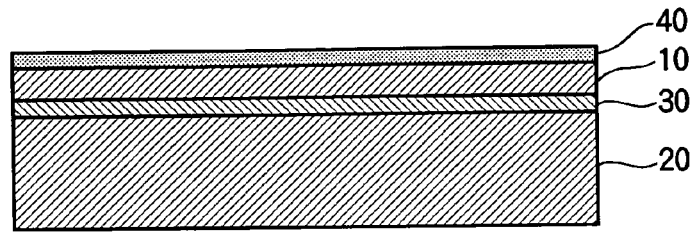

Referring to FIG. 7, in the second step, a protective film 40 of silicon oxide approximately 0.4 μm thick is formed on the surface of the first silicon substrate 10 by thermal oxidation in a wet atmosphere at a temperature of about 1000° C.

Figure 8:
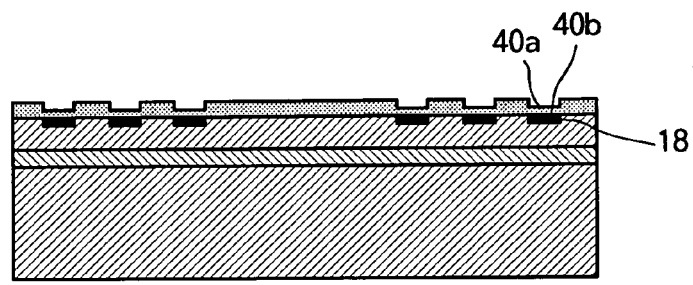

Referring to FIG. 8, in the third step, openings 40a are formed in the protective film 40 by photolithography and etching, and boron is diffused through the openings 40a to form p-type diffusion layers 18, which become the resistive elements 16 and other circuit elements. In addition, a protective oxide film 40b is formed on the surface of the diffusion layers 18 by chemical vapor deposition (CVD).

Figure 9:
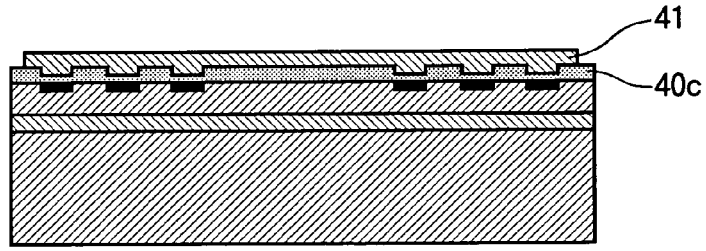

Referring to FIG. 9, in the fourth step, electrode lead openings 40c are opened in the protective oxide film 40b by photolithography and etching, and aluminum is deposited on the protective film 40 by a metal sputtering method. The aluminum is then patterned by photolithography and etching to form interconnection wiring 41.

Figure 10:
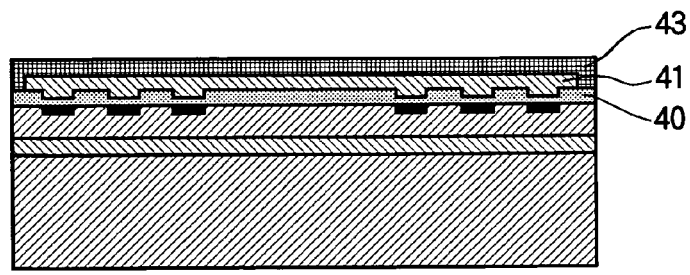

Referring to FIG. 10, in the fifth step, a protective silicon nitride film 43 is formed on the surfaces of the protective film 40 and the interconnection wiring 41 formed thereon by plasma reactive deposition (PRD). For clarity, the silicon nitride film 43 will be omitted in the subsequent drawings.

Figure 11:
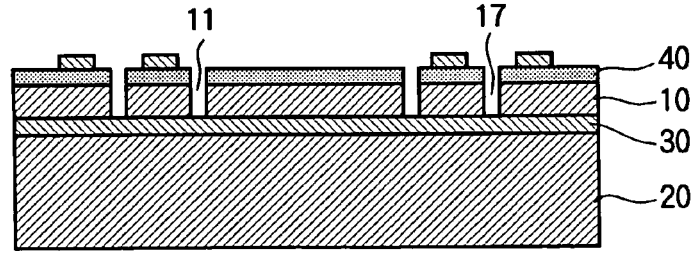

Referring to FIG. 11, in the sixth step, a layer of photoresist (not shown) is applied to the silicon nitride film 43, and trenches 11 and openings 17 are formed by photolithography and etching. The trenches 11 define the beams 14 and stoppers 15. The openings 17 will be used for removing the bonding layer 30 disposed between the outer masses 23b and stoppers 15 in a later step.

Figure 12:
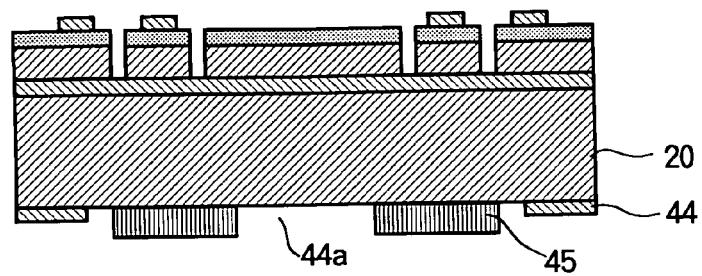

Referring to FIG. 12, in the seventh step, an oxide film 44 is formed by CVD on the reverse side of the SOI wafer, that is, on the surface of the second silicon substrate 20. The central portion of the oxide film 44 is removed by photolithography and etching to form an opening 44a, while the periphery of the oxide film 44 is left intact beneath the frame 21. A photoresist mask 45 masking what will become the mass 23 is formed in the opening 44a.

Figure 13:
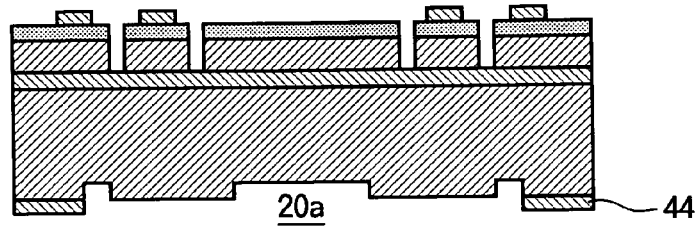

Referring to FIG. 13, in the eighth step, using the oxide film 44 left in the periphery and the photoresist film 45 as an etching mask, the surface of the second silicon substrate 20 is etched to a depth of about 20 μm by a gas chopping etching technique (GCET), also known as the Bosch method, to form a recessed area 20a. The photoresist film 45 is then removed.

Figure 14:
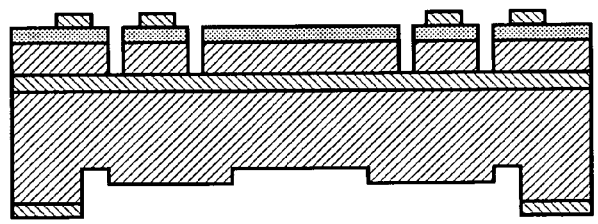

Referring to FIG. 14, in the ninth step, using the oxide film 44 as an etching mask, the surface of the second silicon substrate 20 is etched to an additional depth of about 5 μm by GCET, thereby obtaining a mass 23 having a thickness approximately 5 μm thinner than the thickness of the frame 21.

Figure 15:
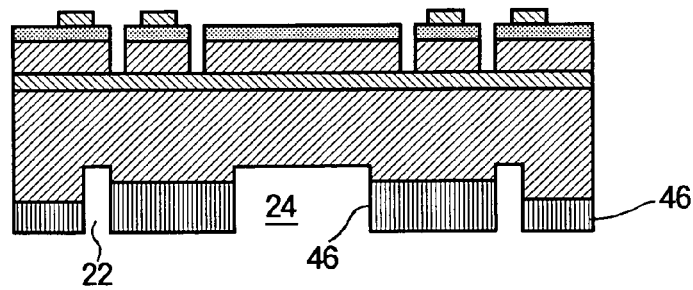

Referring to FIG. 15, in the tenth step, an etching mask 46, which will be used to create the space 22 between the frame 21 and mass 23 and the trench 24 in the second silicon substrate 20, is formed by photolithography.

Figure 16:
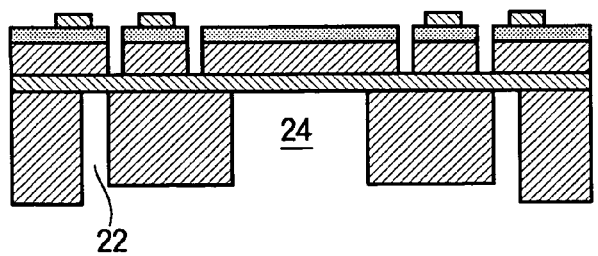

Referring to FIG. 16, in the eleventh step, the space 22 and trenches 24 are formed on the second silicon substrate 20 by GCET.

Figure 17:
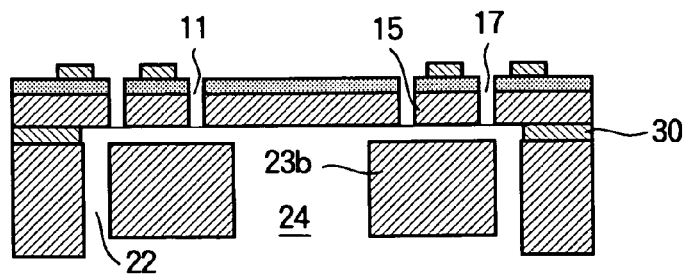

Referring to FIG. 17, in the twelfth step, the SOI wafer, which has completed the processes in steps 1 to 11, is dipped in buffered hydrofluoric acid to etch the bonding layer 30 between the first silicon substrate 10 and second silicon substrate 20. During the dip, the acid penetrates from the openings 17 in the first silicon substrate 10 and the space 22 and trenches 24 in the second silicon substrate 20, and removes the part of the bonding layer 30 disposed between the mass 23 and stoppers 15.

Figure 18:
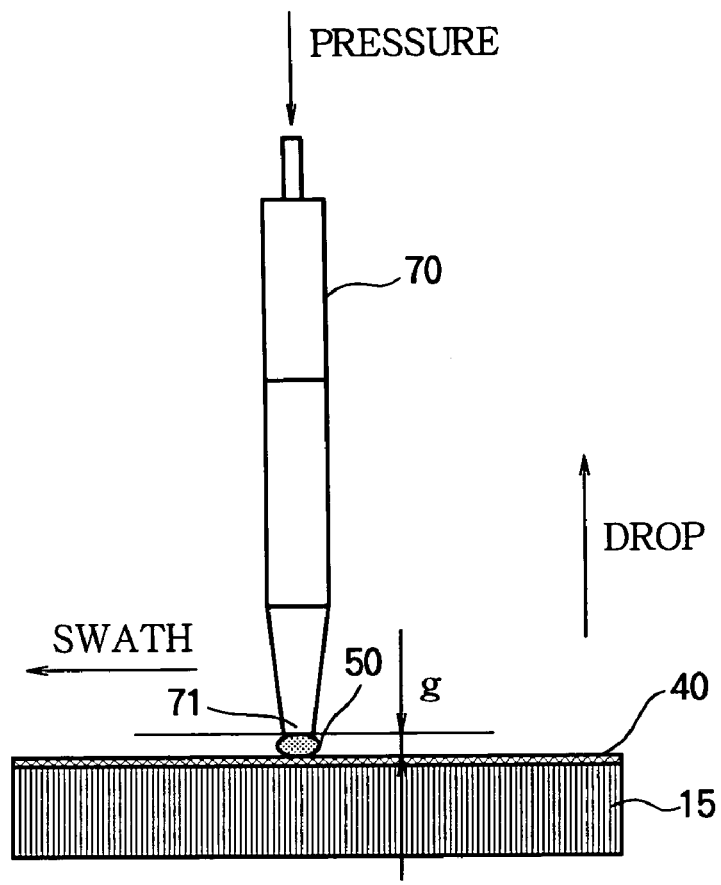

In the thirteenth step silicone rubber 50 is applied by using, for example, a dispenser 70 as shown in FIG. 18. The dispenser 70 is a generally tubular device containing silicone rubber in a highly viscous liquid state, having at one end a nozzle 71 from which a certain quantity of the silicone rubber 50 is dispensed when a predetermined pressure is applied at the other end. Exemplary application conditions (dispensing conditions) for the silicone rubber 50 are as follows:

| | |
|---|---|
| Pressure | 400 kPa |
| Application speed | 400 ms |
| Nozzle diameter | 150 μm |
| Gap (g) | 0.10 mm |
| Silicone rubber | viscous paste |

The viscosity of the silicone rubber 50 should be such that when applied to the stoppers 15, the silicone rubber 50 will not flow through the openings 17 therein.

Under dispensing conditions such as those described above, the dispenser 70 is moved successively to a position above each stopper 15, with a prescribed gap (g) between the tip of the nozzle 71 and the protective film 40 covering the stopper 15; the prescribed amount of silicone rubber 50 is dispensed from the nozzle 71 in the liquid paste state; then the dispenser 70 is pulled back. This procedure applies one drop of silicone rubber 50 with a height of 250 μm or more to the stopper 15. The silicone rubber 50 is left for about thirty minutes to one hour at a temperature of 100° C. to 120° C. to cure from the liquid state to an elastic solid state. The stoppers 15 are thereby reinforced by an elastic material.

Figure 19:
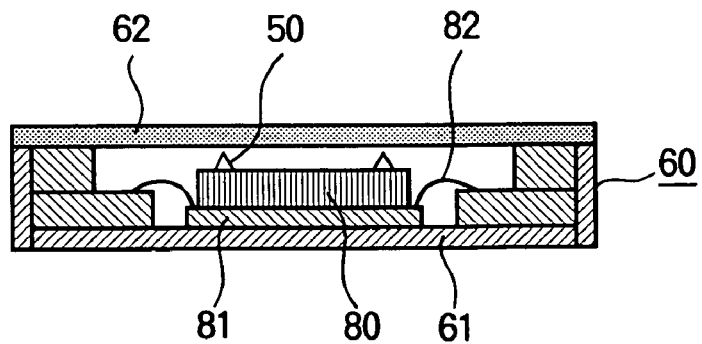

In the fourteenth step, as in ordinary semiconductor fabrication, an acceleration sensor chip 80 is diced from the SOI wafer and mounted in, for example, a package 60 like the one shown in FIG. 19. The package 60 has a hollow structure with a solid floor 61 on which the chip is mounted and an open top that is sealed by a lid 62 after the chip has been mounted. In this example, an integrated circuit chip 81 (referred to below as an 'IC chip') for controlling the acceleration sensor is bonded on the floor 61 and the acceleration sensor chip 80 is stacked on the IC chip 81. The acceleration sensor chip 80 and IC chip 81 are electrically interconnected and are connected to package terminals or leads (not shown) by wires 82; then the package 60 is sealed by the lid 62, completing the mounting process.

In a variation of the thirteenth and fourteenth steps, the silicone rubber 50 is applied after the acceleration sensor chip 80 is diced from the SOI wafer and mounted in the package 60. Further, although a stacked structure is shown in FIG. 19, the acceleration sensor chip 80 and IC chip 81 may be bonded side by side to the package floor 61, or the IC chip 81 may be located outside the package 60.

The acceleration sensor chip 80 manufactured by the above method operates as follows:

If an upward acceleration is applied to the acceleration sensor chip 80 housed in the package 60, the beams 14 bend down and the mass 23 moves downward. The downward movement of the mass 23 stops when its bottom surface strikes the floor 61 of the package 60 (in the stacked structure, the surface of the IC chip 81), which blocks further downward movement. If a downward acceleration is applied to the acceleration sensor chip 80, the beams 14 bend up and the mass 23 moves upward, stopping when the outer masses 23b strike the stoppers 15, which block further upward movement. Since the stoppers 15 are reinforced by the drops of silicone rubber 50, even when a sudden strong acceleration causes the outer masses 23b to impact forcefully on the stoppers 15, the impact force is absorbed by the silicone rubber 50, which significantly improves the ability of the acceleration sensor chip 80 to survive impact.

The electrical resistance of the resistive elements 16 formed in the four beams 14 varies depending on the amount by which the beams 14 bend and the direction of the bend. The magnitude and direction of the acceleration can be calculated from the resistance variations of the resistive elements 16.

The first embodiment provides at least the following four effects:

(i) Excessive movement of the mass 23 is blocked in the upward direction by the stoppers 15, which are reinforced by the silicone rubber 50, and in the downward direction by the floor 61 of the package 60 (in the stacked structure, the front surface of the IC chip 81). Destruction of the acceleration sensor due to excessive bending of the beams 14 is thereby prevented.

(ii) Compared with the conventional structure in which the stoppers are reinforced by thick aluminum films, the structure according to the present embodiment, in which the stoppers 15 are reinforced by drops of silicone rubber 50, is easier to manufacture, requires fewer manufacturing process steps, and has a lower manufacturing cost. This is because the prescribed quantity of silicone rubber 50 can be simply and accurately applied from a dispenser.

(iii) When the stoppers 15 are not reinforced, as shown in FIG. 1, the impact resistance is, for example, 2000 G or less; reinforcement of the stoppers 15 by application of silicone rubber 50 as shown in FIG. 2 improves the impact resistance to, for example, 6000 G or more.

(iv) If a structure is employed in which the top of the silicone rubber 50 adheres to the back surface of the lid 62 of the package 60, it is possible not only to strengthen the reinforcement of the stoppers 15 but also to make the package 60 thinner.

Second Embodiment

Figure 20:
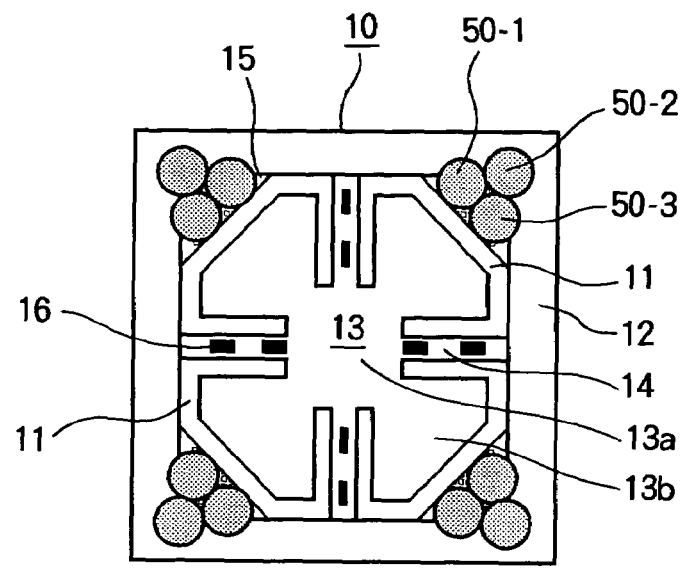
FIG. 20 is a plan view of an acceleration sensor in a second embodiment.

In a second embodiment, the silicone rubber reinforcement is applied as a plurality of drops (for example, three drops 50-1, 50-2, 50-3 as shown in FIG. 20) to each of the stoppers 15 from the dispenser 70. Otherwise, the structure and manufacturing method are the same as in the first embodiment.

In the first embodiment, since the silicone rubber 50 is applied as one drop, a height of, for example, 250 μm or more is required for adequate reinforcement, and the package 60 must be thick enough to accommodate this height. In the second embodiment, since the silicone rubber applied to each stopper 15 is dispensed from the dispenser 70 as a plurality of smaller drops 50-1 to 50-3, the heights of the drops can be reduced to as little as about 150 μm while still providing adequate reinforcement, so the thickness of the package 60 can be reduced. Impact resistance is also improved in that the reinforcement is spread over a wider area of the stoppers 15.

Third Embodiment

In a third embodiment, silicone rubber 50A is applied by the dispenser 70 as a swath covering at least part of all of the stoppers 15 and part of the adjacent surface of the peripheral attachment section 12 to reinforce the stoppers 15 and peripheral attachment section 12. As shown in FIG. 18, for example, if the dispenser 70 moves in a line along the peripheral attachment section 12, starting from one stopper 15 and ending at another stopper 15, the silicone rubber 50A can be applied as a single continuous swath. In this case, a uniform swath of silicone rubber 50A can be applied by lifting the dispenser 70 away from the peripheral attachment section 12 as the dispenser 70 retraces the final part of the swath, moving backward from the final application point.

Figure 21:
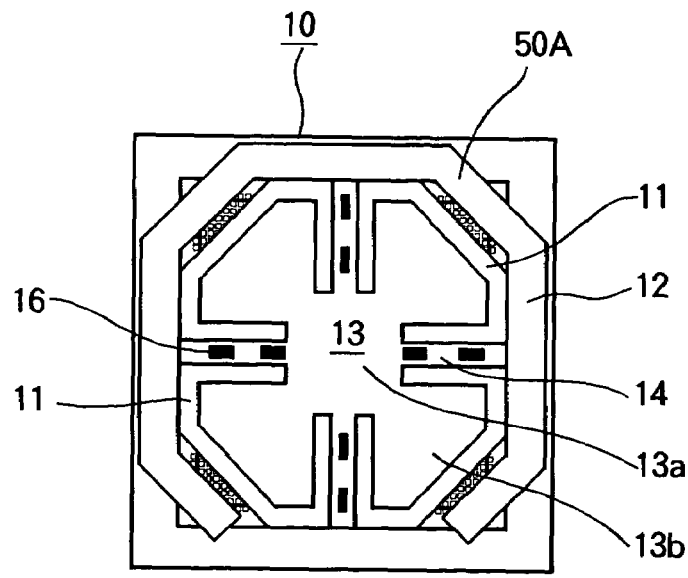
FIG. 21 is a plan view of an acceleration sensor in a third embodiment.

In FIG. 21, since the silicone rubber 50A is not applied in a complete loop, there is a part of the peripheral attachment section 12 to which no silicone rubber is applied. Electrical interconnection terminals can be located in this area, so that the silicone rubber 50A does not interfere with electrical interconnections.

According to the third embodiment, since the silicone rubber 50A is applied as a swath by the dispenser 70 to reinforce the stoppers 15 and peripheral attachment section 12, the height of the silicone rubber 50A can be reduced to a level even lower than in the second embodiment.

The present invention is not limited to the above embodiments; various modifications are possible. For example:

(a) The acceleration sensor need not be square in shape; it may be rectangular or circular. The dimensions of the first and second silicon substrates and other dimensions are not limited to the exemplary values given above.

(b) The silicone rubber used as a curable elastic adhesive to reinforce the stoppers in the embodiments above can be replaced with any other material that can be dispensed as a viscous liquid, cures to an elastic adhesive form, and has good mechanical and chemical properties.

(c) The methods of manufacturing and mounting the acceleration sensor are not limited to the methods described above.

Those skilled in the art will recognize that further variations are possible within the scope of the invention, which is defined in the appended claims.

What is claimed is:

1. An acceleration sensor having a mass movably linked to a peripheral attachment section, the mass moving, in response to acceleration, in at least a first direction relative to the peripheral attachment section, comprising:

at least one stopper fixedly attached to the peripheral attachment section for stopping motion of the mass in the first direction, the stopper having a first major surface and a second major surface, the first major surface being disposed between the second major surface and the mass and, absent said acceleration, being spaced from the mass in the first direction; and a quantity a curable elastic adhesive disposed on the second major surface of the stopper for absorbing impact of the mass on the first major surface of the stopper, wherein the curable elastic adhesive comprises a single drop per stopper.

2. The acceleration sensor of claim 1, wherein the acceleration sensor is mounted in a package having a lid to which the curable elastic adhesive adheres.

3. The acceleration sensor of claim 2, wherein the package also has a floor, the mass being disposed between the floor and the stopper and, absent said acceleration, being spaced from the floor in the first direction.

4. The acceleration sensor of claim 1, wherein the curable elastic adhesive comprises a silicone rubber that cures from a liquid state to an elastic solid state.

5. The acceleration sensor of claim 1, wherein the curable elastic adhesive is disposed both on the stopper and on an adjacent surface of the peripheral attachment section.

6. The acceleration sensor of claim 1, further comprising:

a mass attachment section attached to the mass; and at least one beam flexibly linking the mass attachment section to the peripheral attachment section.

7. The acceleration sensor of claim 6, wherein the mass has a surface with one part occupied by the mass attachment section and another part, not occupied by the mass attachment section, that meets the at least one stopper when the mass moves a certain distance in the first direction relative to the peripheral attachment section.

8. The acceleration sensor of claim 7, further comprising a strain sensing device disposed on a surface of the at least one beam.

9. The acceleration sensor of claim 7, wherein the peripheral attachment section, the mass attachment section, the at least one beam, and the at least one stopper form a unitary structure.

10. The acceleration sensor of claim 7, further comprising a base and a frame disposed between the base and the peripheral attachment section, the frame having a thickness such that, absent said acceleration, the mass is spaced from the base in the first direction.

11. The acceleration sensor of claim 10, wherein the frame surrounds the mass and, absent said acceleration, is spaced from the mass in a second direction orthogonal to the first direction and a third direction orthogonal to the first direction and the second direction.

12. The acceleration sensor of claim 10, further comprising a bonding layer disposed between the mass attachment section and the mass, and between the peripheral attachment section and the frame.

13. An acceleration sensor having a mass movably linked to a peripheral attachment section, the mass moving, in response to acceleration, in at least a first direction relative to the peripheral attachment section, comprising:
　at least one stopper fixedly attached to the peripheral attachment section for stopping motion of the mass in the first direction, the stopper having a first major surface and a second major surface, the first major surface being disposed between the second major surface and the mass and, absent said acceleration, being spaced from the mass in the first direction; and
　a quantity of a curable elastic adhesive disposed on the second major surface of the stopper for absorbing impact of the mass on the first major surface of the stopper,
　wherein the curable elastic adhesive comprises a plurality of drops per stopper.

14. The acceleration sensor of claim 13, wherein the acceleration sensor is mounted in a package having a lid to which the curable elastic adhesive adheres.

15. The acceleration sensor of claim 14, wherein the package also has a floor, the mass being disposed between the floor and the stopper and, absent said acceleration, being spaced from the floor in the first direction.

16. The acceleration sensor of claim 13, wherein the curable elastic adhesive comprises a silicone rubber that cures from a liquid state to an elastic solid state.

17. The acceleration sensor of claim 13, wherein the curable elastic adhesive is disposed both on the stopper and on an adjacent surface of the peripheral attachment section.

18. The acceleration sensor of claim 13, further comprising:
　a mass attachment section attached to the mass; and
　at least one beam flexibly linking the mass attachment section to the peripheral attachment section.

19. The acceleration sensor of claim 18, wherein the mass has a surface with one part occupied by the mass attachment section and another part, not occupied by the mass attachment section, that meets the at least one stopper when the mass moves a certain distance in the first direction relative to the peripheral attachment section.

20. The acceleration sensor of claim 19, further comprising a strain sensing device disposed on a surface of the at least one beam.

21. The acceleration sensor of claim 19, wherein the peripheral attachment section, the mass attachment section, the at least one beam, and the at least one stopper form a unitary structure.

22. The acceleration sensor of claim 19, further comprising a base and a frame disposed between the base and the peripheral attachment section, the frame having a thickness such that, absent said acceleration, the mass is spaced from the base in the first direction.

23. The acceleration sensor of claim 22, wherein the frame surrounds the mass and, absent said acceleration, is spaced from the mass in a second direction orthogonal to the first direction and a third direction orthogonal to the first direction and the second direction.

24. The acceleration sensor of claim 22, further comprising a bonding layer disposed between the mass attachment section and the mass, and between the peripheral attachment section and the frame.

25. An acceleration sensor having a mass movably linked to a peripheral attachment section that surrounds the mass, the mass moving, in response to acceleration, in at least a first direction relative to the peripheral attachment section, comprising:
　a plurality of stoppers fixedly attached to the peripheral attachment section at different points each stopper stopping motion of the mass in the first direction and having a first major surface and a second major surface, the first major surface being disposed between the second major surface and the mass and, absent said acceleration, being spaced from the mass in the first direction; and
　a single continuous swath of a curable elastic adhesive applied to the second major surface of all of the stoppers and an adjacent surface of the peripheral attachment section for absorbing impact of the mass on the first major surface of the stoppers, the single continuous swath at least partly covering all of the stoppers, the single continuous swath having a substantially constant width on both the stoppers and the peripheral attachment section.

26. The acceleration sensor of claim 25, wherein the acceleration sensor is mounted in a package having a lid to which the curable elastic adhesive adheres.

27. The acceleration sensor of claim 26, wherein the package also has a floor, the mass being disposed between the floor and the stopper and, absent said acceleration, being spaced from the floor in the first direction.

28. The acceleration sensor of claim 25, wherein the curable elastic adhesive comprises a silicone rubber that cures from a liquid state to an elastic solid state.

29. The acceleration sensor of claim 25, wherein the curable elastic adhesive is disposed both on the stopper and on an adjacent surface of the peripheral attachment section.

* * * * *